United States Patent
Kusunoki et al.

(10) Patent No.: US 9,725,800 B2
(45) Date of Patent: Aug. 8, 2017

(54) VAPORIZING SYSTEM

(71) Applicant: Kabushiki Kaisha Toshiba, Minato-ku (JP)

(72) Inventors: Mari Kusunoki, Yokkaichi (JP); Shinji Miyazaki, Miegunkawagoe (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 113 days.

(21) Appl. No.: 14/794,109

(22) Filed: Jul. 8, 2015

(65) Prior Publication Data
US 2016/0288155 A1 Oct. 6, 2016

(30) Foreign Application Priority Data
Mar. 31, 2015 (JP) .................. 2015-072425

(51) Int. Cl.
*C23C 14/24* (2006.01)
*B65D 88/02* (2006.01)
*C23C 16/448* (2006.01)
*C23C 16/52* (2006.01)

(52) U.S. Cl.
CPC .......... *C23C 14/243* (2013.01); *B65D 88/022* (2013.01); *B65D 88/027* (2013.01); *C23C 16/4485* (2013.01); *C23C 16/52* (2013.01); *Y10T 137/469* (2015.04); *Y10T 137/4673* (2015.04); *Y10T 137/474* (2015.04); *Y10T 137/479* (2015.04); *Y10T 137/4841* (2015.04); *Y10T 137/4857* (2015.04); *Y10T 137/8622* (2015.04); *Y10T 137/86187* (2015.04); *Y10T 137/86228* (2015.04)

(58) Field of Classification Search
CPC .......... Y10T 137/4857; Y10T 137/479; Y10T 137/469; Y10T 137/4841; Y10T 137/474; Y10T 137/86187; Y10T 137/4673; Y10T 137/86228; Y10T 137/8622; B65D 88/027; B65D 88/022; B65D 88/0066; Y10S 261/65; C23C 14/243
See application file for complete search history.

(56) References Cited

U.S. PATENT DOCUMENTS

| | | | | |
|---|---|---|---|---|
| 5,286,350 | A | * 2/1994 | Huang | ..................... B01D 1/26 202/174 |
| 6,014,995 | A | * 1/2000 | Agnew | ................. B60P 3/2245 137/208 |
| 6,149,975 | A | 11/2000 | Tasaki et al. | |
| 6,270,839 | B1 | 8/2001 | Onoe et al. | |

(Continued)

FOREIGN PATENT DOCUMENTS

| | | |
|---|---|---|
| JP | 3909792 | 4/2007 |
| JP | 3967455 | 8/2007 |
| JP | 2013-222768 | 10/2013 |

*Primary Examiner* — Atif Chaudry
(74) *Attorney, Agent, or Firm* — Oblon, McClelland, Maier & Neustadt, L.L.P.

(57) ABSTRACT

According to one embodiment, a vaporizing system comprises first and second tanks that can accumulate liquid source and first, second, and third pipes. The first pipe allows first gas to be sent out of the first tank. The second pipe allows second gas to be sent out of the second tank. The third pipe is connected to the first and second pipes and allows the first and second gas to be sent out to an external apparatus. The first tank is placed on an upper side of the second tank in a stacked manner.

20 Claims, 5 Drawing Sheets

(56) References Cited

U.S. PATENT DOCUMENTS

| | | | | |
|---|---|---|---|---|
| 7,680,399 | B2* | 3/2010 | Buchanan | F22B 35/005 |
| | | | | 392/386 |
| 8,011,383 | B2* | 9/2011 | Mowatt | B60K 15/06 |
| | | | | 137/256 |
| 2006/0133955 | A1* | 6/2006 | Peters | C23C 16/4481 |
| | | | | 422/63 |
| 2007/0163660 | A1* | 7/2007 | Mowatt | B60K 15/06 |
| | | | | 137/572 |
| 2007/0181703 | A1* | 8/2007 | Buchanan | F22B 35/005 |
| | | | | 237/58 |
| 2015/0165249 | A1* | 6/2015 | Matchett | A62C 3/04 |
| | | | | 169/45 |

* cited by examiner

FIG.5
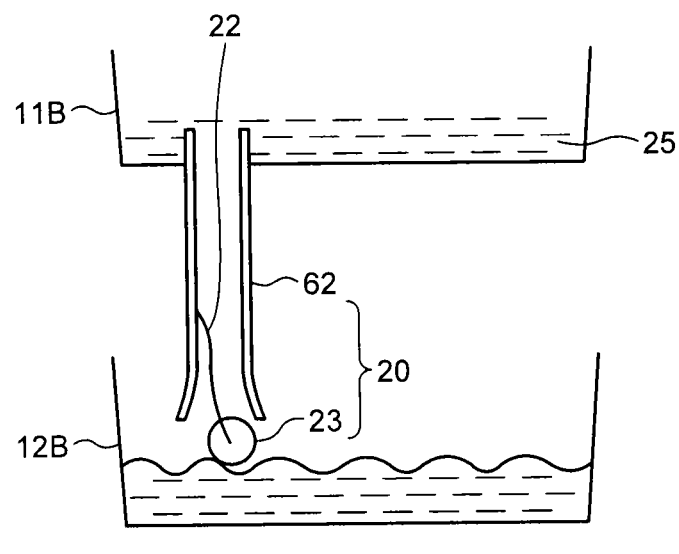
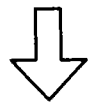
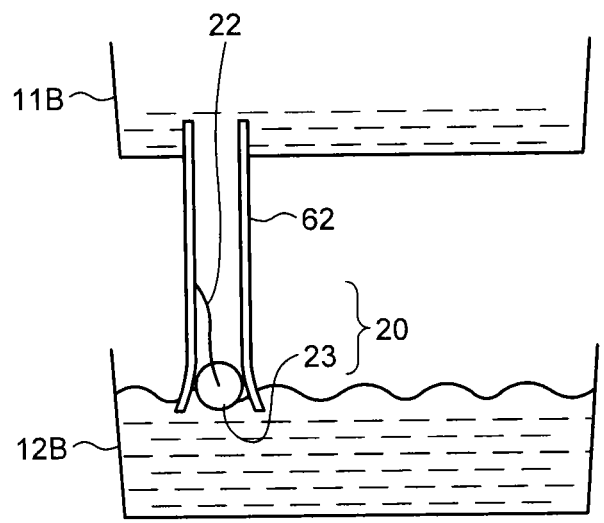

VAPORIZING SYSTEM

CROSS-REFERENCE TO RELATED APPLICATIONS

This application is based upon and claims the benefit of priority from Japanese Patent Application No. 2015-072425, filed on Mar. 31, 2015; the entire contents of which are incorporated herein by reference.

FIELD

Embodiments described herein relate generally to a vaporizing system.

BACKGROUND

In the process of manufacturing semiconductor devices, there are steps in which a liquid source is vaporized to form a film over a substrate. In a vaporizing system that vaporizes a liquid source, one tank is charged with the liquid source so as to have the liquid source vaporized in this one tank. Then vaporized gas is taken out of the tank and sent to an external apparatus such as a film forming apparatus.

However, with conventional vaporizing systems, if the capacity of the tank is made smaller in order to make the vaporizing system smaller, a desired gas flow rate may not be able to be obtained. Further, if there is a limit on the specified store amount of the liquid source to be used, the number of vaporizing systems to be installed is restricted.

BRIEF DESCRIPTION OF THE DRAWINGS

FIG. 5 is a diagram showing an example configuration of a check valve according to the third embodiment.

DETAILED DESCRIPTION

According to the present embodiment, a vaporizing system is provided. The vaporizing system comprises a first tank that can accumulate liquid source and a second tank that can accumulate the liquid source. The vaporizing system further comprises a first pipe, a second pipe, and a third pipe. The first pipe allows first gas generated by the liquid source vaporizing in the first tank to be sent out of the first tank therethrough. The second pipe allows second gas generated by the liquid source vaporizing in the second tank to be sent out of the second tank therethrough. The third pipe is connected to the first and second pipes and allows the first and second gas to be sent out to an external apparatus therethrough. The first tank is placed on an upper side of the second tank in a stacked manner.

First Embodiment

The vaporizing systems according to embodiments will be described in detail below with reference to the accompanying drawings. The present invention is not limited to these embodiments.

Figure 1:
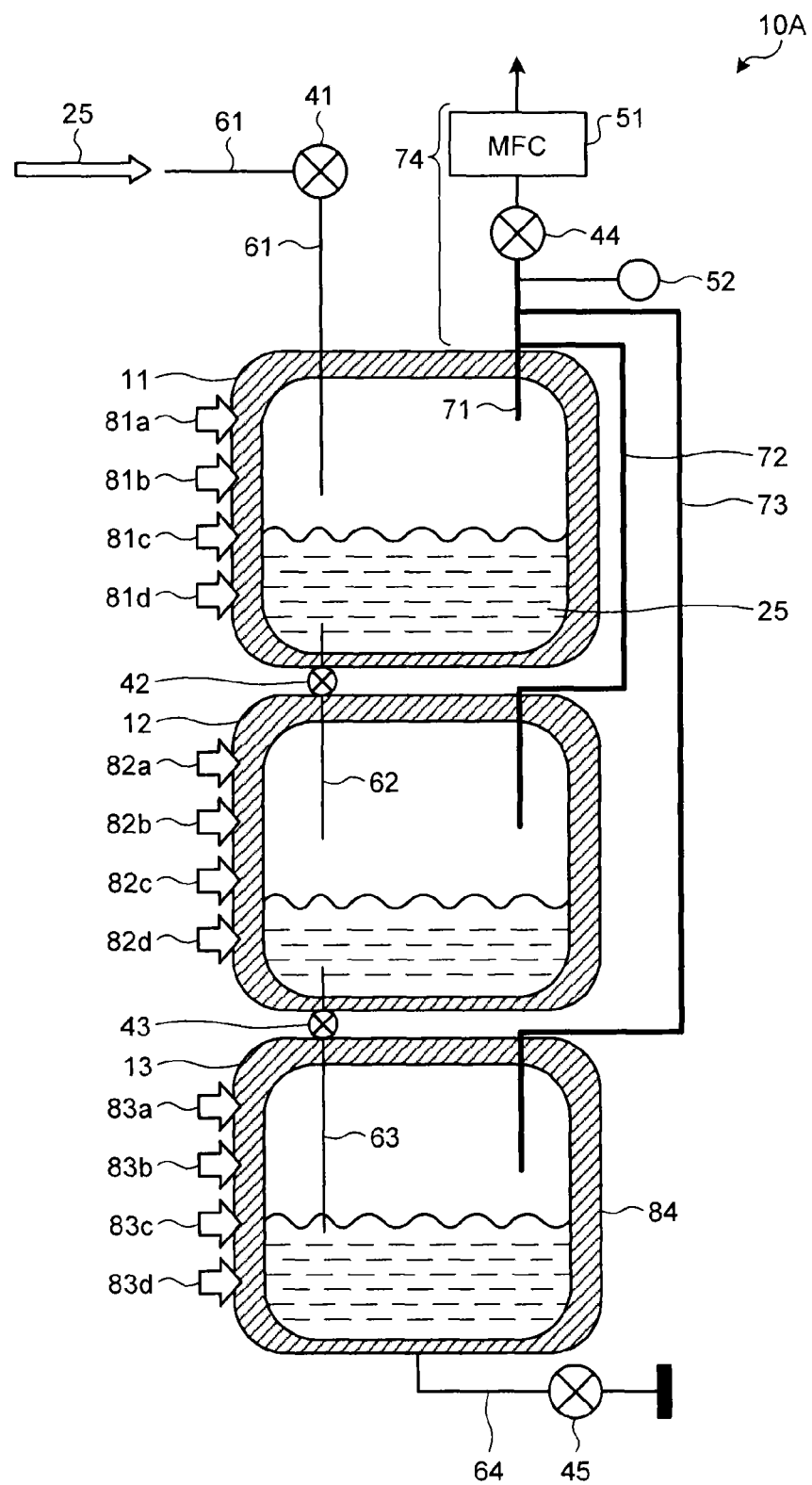
FIG. 1 is a diagram showing the configuration of a vaporizing system according to a first embodiment.

FIG. 1 is a diagram showing the configuration of a vaporizing system according to the first embodiment. FIG. 1 shows schematically the cross-section configuration of the vaporizing system 10A. The vaporizing system 10A has multiple tanks and is a system which vaporizes a liquid source 25 in the multiple tanks.

The vaporizing system 10A comprises tanks 11 to 13. The vaporizing system 10A further comprises an MFC (mass flow controller) 51 that is an example of a gas flowmeter, a pressure meter 52, valves 41 to 45, and pipes 61 to 64, 71 to 74. The tanks 11 to 13 each comprise a heater 84 to heat the liquid source 25 to a temperature suitable to vaporize.

The tanks 11 to 13 store the liquid source 25 to vaporize. The tanks 11 to 13 are formed of material suitable to preserve the liquid source 25. In the vaporizing system 10A, the tanks 11 to 13 charged with the liquid source are stacked up to be arranged along a vertical direction.

The tank 12 is placed under the tank 11, and the tank 13 is placed under the tank 12. A pipe 61 is placed on the upper side of the tank 11. The tank 11 and the tank 12 are connected by a pipe 62. The tank 12 and the tank 13 are connected by a pipe 63.

The liquid source 25 is supplied from a feeding device (not shown) (hereinafter called a liquid feeding device) for the liquid source 25 to the tanks 11 to 13. The liquid source 25 is, for example, hexachlorodisilane, tetraethoxysilane, TMB (trimethoxyborane), or the like.

The pipe 61 connects the liquid feeding device and the tank 11. The pipe 61 extends through the top of the tank 11. One end of the pipe 61 is connected to the liquid feeding device, and the other end is located inside the tank 11. With this configuration, the liquid source 25 is sent from the liquid feeding device to the tank 11 via the pipe 61. Then the liquid source 25 is dribbled from the upper side of the tank 11 through the pipe 61 into the tank 11.

The pipe 62 extends through the bottom of the tank 11 and through the top of the tank 12. One end of the pipe 62 is located near the bottom of the tank 11, and the other end of the pipe 62 is located inside the tank 12. The one end of the pipe 62 allows the liquid source 25 in the tank 11 to be taken through, and the other end of the pipe 62 allows the liquid source 25 to dribble into the tank 12 through. With this configuration, the liquid source 25 at the bottom of the tank 11 is sent to the tank 12 via the pipe 62. Then the liquid source 25 is dribbled from the upper side of the tank 12 through the pipe 62 into the tank 12.

The pipe 63 extends through the bottom of the tank 12 and through the top of the tank 13. One end of the pipe 63 is located near the bottom of the tank 12, and the other end of the pipe 63 is located inside the tank 13. The one end of the pipe 63 allows the liquid source 25 in the tank 12 to be taken through, and the other end of the pipe 63 allows the liquid source 25 to dribble into the tank 13 through. With this configuration, the liquid source 25 at the bottom of the tank 12 is sent to the tank 13 via the pipe 63. Then the liquid source 25 is dribbled from the upper side of the tank 13 through the pipe 63 into the tank 13.

The valve (recharge valve) 41 is placed at a point along the pipe 61. When the valve 41 is opened, the liquid source 25 flows from the liquid feeding device to the tank 11 via the pipe 61. When the valve 41 is closed, the supply of the liquid source 25 from the liquid feeding device to the tank 11 via the pipe 61 is stopped. The valve 41 is closed when a liquid level sensor detects that the inside of the tank 11 has been charged up to a predetermined height with the liquid source 25.

The valve 42 is placed at a point along the pipe 62. When the valve 41 is opened, the liquid source 25 flows from the tank 11 to the tank 12 via the pipe 62. When the valve 42 is closed, the supply of the liquid source 25 from the tank 11 to the tank 12 via the pipe 62 is stopped. The valve 42 is closed when a liquid level sensor detects that the inside of the tank 12 has been charged up to a predetermined height with the liquid source 25.

The valve 43 is placed at a point along the pipe 63. When the valve 43 is opened, the liquid source 25 flows from the tank 12 to the tank 13 via the pipe 63. When the valve 43 is closed, the supply of the liquid source 25 from the tank 12 to the tank 13 via the pipe 63 is stopped. The valve 43 is closed when a liquid level sensor detects that the inside of the tank 13 has been charged up to a predetermined height with the liquid source 25.

The pipe 71 is connected to the upper side of the tank 11. The pipe 72 is connected to the upper side of the tank 12. The pipe 73 is connected to the upper side of the tank 13.

The pipe 71 extends through the top of the tank 11 and is connected to the pipe 74. The pipe 72 extends through the top of the tank 12 and is connected to the pipe 74. The pipe 73 extends through the top of the tank 13 and is connected to the pipe 74.

One end of the pipe 71 is located on the upper side of the inside of the tank 11 to have gas in the tank 11 flow in through it. The one end of the pipe 71 is located at such a height inside the tank 11 as not to touch the liquid source 25 (liquid).

One end of the pipe 72 is located on the upper side of the inside of the tank 12 to have gas in the tank 12 flow in through it. The one end of the pipe 72 is located at such a height inside the tank 12 as not to touch the liquid source 25.

One end of the pipe 73 is located on the upper side of the inside of the tank 13 to have gas in the tank 13 flow in through it. The one end of the pipe 73 is located at such a height inside the tank 13 as not to touch the liquid source 25.

The gas flowing into the pipes 71 to 73 is gas into which the liquid source 25 is vaporized in the tanks 11 to 13. The gas having flowed into the pipes 71 to 73 is sent to the pipe 74. The valve (primary valve) 44 is placed at a point along the pipe 74. The valve 44 is placed on the MFC 51 side or downstream of the connection positions between the pipes 71 to 73 and the pipe 74.

The MFC 51 is connected to a point along the pipe 74. The MFC 51 measures the flow rate of gas flowing through the pipe 74 so as to allow a set amount of gas to flow from upstream to downstream. The pressure meter 52 is placed at a point along the pipe 74 between the position where the pipes 71 to 73 merge and the valve 44. The pressure meter 52 measures the pressure (evaporated vapor pressure) of gas flowing through the pipe 74.

Further, the pipe 64 is connected to the bottom of the tank 13. The valve (drain valve) 45 is placed at a point along the pipe 64. One end of the pipe 64 is located adjacent to the bottom of the tank 13, and the other end of the pipe 64 is usually sealed. The pipe 64 can be connected to an external device (not shown). If the liquid source 25 in the tanks 11 to 13 becomes unnecessary, an external device is connected to the pipe 64, and the valve 45 is opened. Thus, the liquid source 25 in the tanks 11 to 13 can be drained into the external device via the pipe 64.

Multiple liquid level sensors (liquid level detector units) are provided in each of the tanks 11 to 13. The tank 11 has liquid level sensors 81a to 81d; the tank 12 has liquid level sensors 82a to 82d; and the tank 13 has liquid level sensors 83a to 83d.

The liquid level sensors 81a to 81d are respectively placed at first to fourth heights with respect to the tank 11 to detect whether the liquid source 25 has reached the first to fourth heights in the tank 11 respectively. The heights at which the liquid level sensors 81a to 81d are placed are higher in the order of the liquid level sensors 81a to 81d.

The liquid level sensors 82a to 82d are respectively placed at first to fourth heights with respect to the tank 12 to detect whether the liquid source 25 has reached the first to fourth heights in the tank 12 respectively. The heights at which the liquid level sensors 82a to 82d are placed are higher in the order of the liquid level sensors 82a to 82d.

The liquid level sensors 83a to 83d are respectively placed at first to fourth heights with respect to the tank 13 to detect whether the liquid source 25 has reached the first to fourth heights in the tank 13 respectively. The heights at which the liquid level sensors 83a to 83d are placed are higher in the order of the liquid level sensors 83a to 83d.

The tanks 11 to 13 are surrounded by heaters 84 to heat. Thus, the liquid source 25 in the tanks 11 to 13 is heated to vaporize.

The pipes 71 to 74 are surrounded by tape heaters or the like and heated by the tape heaters or the like. Thus, gas passing through the pipes 71 to 74 is prevented from being liquefied. Note that the pipes 61 to 63 may be surrounded by tape heaters to heat.

The vaporizing system 10A that is a layered vaporizing system is of such a size that it can be installed in the framework of a semiconductor processing apparatus. The vaporizing system 10A has such a size that it can easily replace a conventional vaporizing system in space, for example.

In the vaporizing system 10A, the liquid source 25 is dribbled into the tank 11 via the pipe 61. The liquid source 25 in the tank 11 is dribbled into the tank 12 via the pipe 62. The liquid source 25 in the tank 12 is dribbled into the tank 13 via the pipe 63.

When the liquid source 25 in the tank 11 is vaporized, the vaporized gas is sent out into the pipe 74 via the pipe 71. When the liquid source 25 in the tank 12 is vaporized, the vaporized gas is sent out into the pipe 74 via the pipe 72. When the liquid source 25 in the tank 13 is vaporized, the vaporized gas is sent out into the pipe 74 via the pipe 73.

Then out of the gas sent into the pipe 74, a desired amount of gas is sent out to a film forming apparatus (not shown) via the MFC 51. While the vaporizing system 10A is vaporizing the liquid source 25, the pressure meter 52 measures the pressure of gas flowing through the pipe 74, and the MFC 51 measures the flow rate of gas sent out to the film forming apparatus. Based on the measuring result of the pressure meter 52 and the measuring result of the MFC 51, dribbling the liquid source 25 and sending out gas to the film forming apparatus are controlled. The amounts of the liquid source 25 in the tanks 11 to 13 are detected by the liquid level sensors 81a to 81d, 82a to 82d, 83a to 83d in the tanks 11 to 13 respectively, and as the amounts decrease, the valves 41 to 43 are opened, so that the liquid source 25 is supplied via the pipes 61 to 63 as needed.

Figure 2:
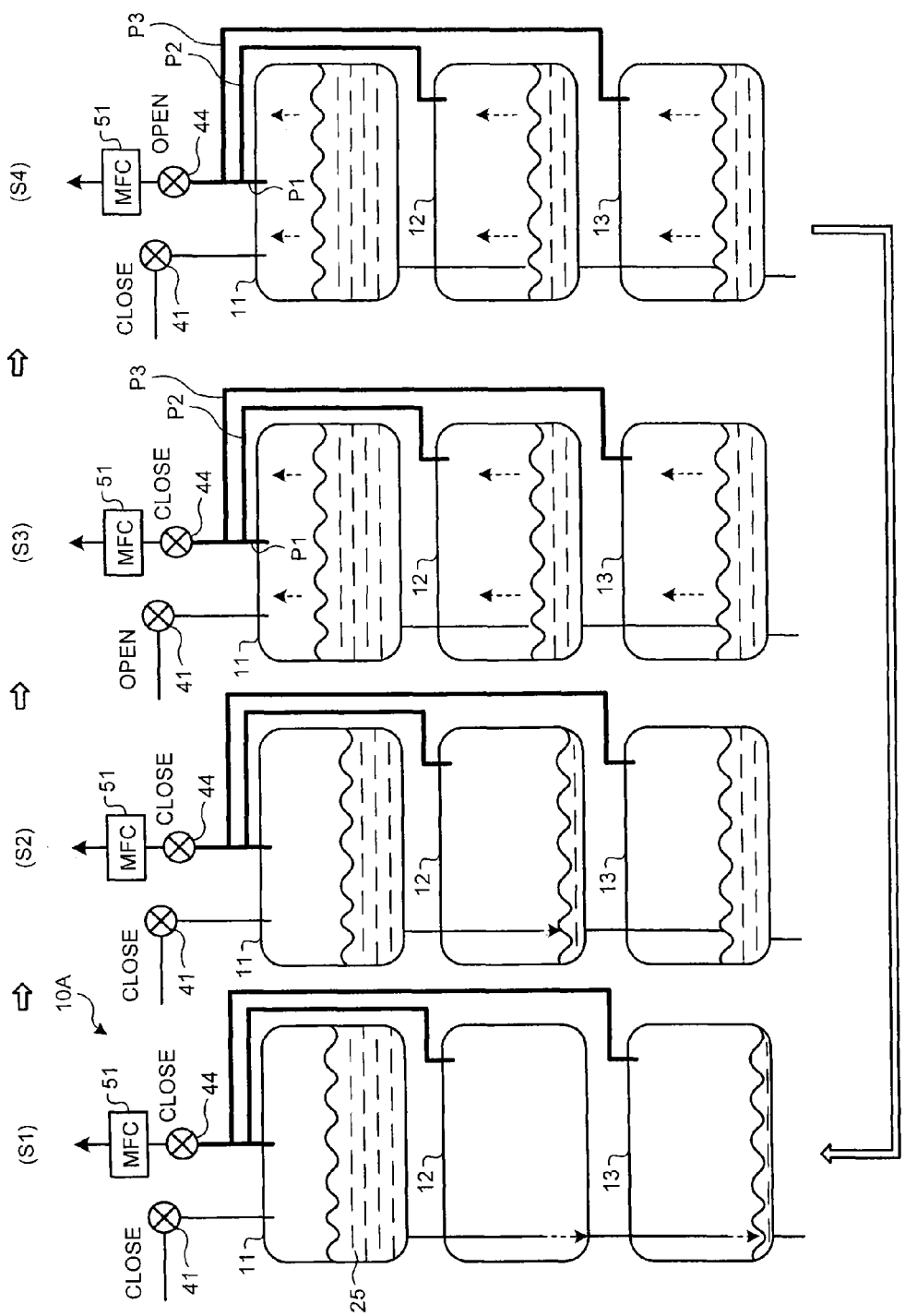
FIG. 2 is a diagram for explaining a vaporization processing procedure in the vaporizing system according to the first embodiment.

Next, a vaporization processing procedure in the vaporizing system 10A will be described. FIG. 2 is a diagram for explaining the vaporization processing procedure in the vaporizing system according to the first embodiment. Note that in the vaporizing system 10A of FIG. 2, the pressure meter 52, valves 42, 43, liquid level sensors 81a to 81d, 82a to 82d, 83a to 83d, heaters 84, drain valve 45, pipe 64, etc., are omitted from the figure.

In the vaporizing system 10A, the valve 41 is opened to charge the inside of the tanks 11 to 13 with the liquid source 25. Thus, the liquid source 25 is sent from the liquid feeding device through the pipe 61 into the tank 11, at which time the valves 44, 45 are closed.

Thereafter, when the liquid level sensors 81a to 81d detect that the inside of the tank 11 has been charged up to a predetermined height with the liquid source 25, the valve 41 is closed. At this point in time, the pressure in the tank 11 is, for example, a pressure P1.

Then the valve 42 placed between the tanks 11 and 12 is opened, and the valve 43 placed between the tanks 12 and 13 is opened. Thus, the liquid source 25 is dribbled into the tanks 12 and 13 that are second and third layers of the vaporizing system 10A (S1). Specifically, the liquid source 25 is dribbled from the tank 11 into the tank 12, and the liquid source 25 is dribbled from the tank 12 into the tank 13.

Then, when the liquid level sensors 83a to 83d detect that the inside of the tank 13 has been charged up to a predetermined height with the liquid source 25, the valve 43 between the tanks 12 and 13 is closed. Thus, dribbling the liquid source 25 from the tank 11 into the tank 12 is continued while dribbling the liquid source 25 from the tank 12 into the tank 13 is stopped (S2). At this point in time, the pressure in the tank 13 is, for example, a pressure P3.

Since the liquid source 25 is dribbled from the tank 11 into the tank 12, the liquid level of the liquid source 25 in the tank 11 falls. When the liquid level sensors 81a to 81d detect that the liquid level of the liquid source 25 has fallen to a predetermined height in the tank 11, the valve 41 is opened. Thus, the liquid source 25 is sent from the liquid feeding device through the pipe 61 into the tank 11 (S3).

Then, when the liquid level sensors 82a to 82d detect that the inside of the tank 12 has been charged up to a predetermined height with the liquid source 25, the valve 42 between the tanks 11 and 12 is closed. Thus, dribbling the liquid source 25 from the tank 11 into the tank 12 is stopped. At this point in time, the pressure in the tank 12 is, for example, a pressure P2. When the liquid level sensors 81a to 81d detect that the inside of the tank 11 has been charged up to a predetermined height with the liquid source 25, the valve 41 is closed.

Note that the insides of the tanks 11 to 13 may be charged with the liquid source 25 while the valves 41 to 43 are open. In this case, when the inside of the tank 13 is charged up to a predetermined height with the liquid source 25, the valve 43 is closed. Then when the inside of the tank 12 is charged up to a predetermined height with the liquid source 25, the valve 42 is closed. Then when the inside of the tank 11 is charged up to a predetermined height with the liquid source 25, the valve 41 is closed.

Thereafter, the valve 44 is opened while the valves 41 to 43, 45 are closed. Thus, gas of the pressure P1 is sent from the tank 11 through the pipe 71 to the MFC 51. Further, gas of the pressure P2 is sent from the tank 12 through the pipe 72 to the MFC 51. Yet further, gas of the pressure P3 is sent from the tank 13 through the pipe 73 to the MFC 51 (S4).

When the valve 44 is opened, the vaporizing system 10A sends out gas in the pipe 74 to an external apparatus such as a film forming apparatus. At this time, the relation between the liquid surface area S1 in the tank 11, the liquid surface area S2 in the tank 12, and the liquid surface area S3 in the tank 13 is represented by, e.g., S1=S2=S3. The relation between the pressure P1 in the tank 11, the pressure P2 in the tank 12, and the pressure P3 in the tank 13 is represented by, e.g., P1=P2=P3.

In the vaporizing system 10A, when the liquid levels of the liquid source 25 fall to predetermined heights in the tanks 11 to 13, the liquid source 25 is supplied for loss into the tanks 11 to 13. For example, when the liquid level of the liquid source 25 falls to a predetermined height in the tank 13, the valve 43 is opened so that the liquid source 25 is supplied for loss into the tank 13. When the liquid level of the liquid source 25 falls to a predetermined height in the tank 12, the valve 42 is opened so that the liquid source 25 is supplied for loss into the tank 12. When the liquid level of the liquid source 25 falls to a predetermined height in the tank 11, the valve 41 is opened so that the liquid source 25 is supplied for loss into the tank 11.

If the liquid level (height above the tank bottom) of the liquid source 25 in any of the tanks 11 to 13 becomes lower than a predetermined height, then the process according to the above S1 to S4 is performed again. For example, when the liquid level in the tank 13 falls, the valve 43 is opened, and when the liquid level in the tank 13 rises to a predetermined value, the valve 43 is closed. When the liquid level in the tank 12 falls, the valve 42 is opened, and when the liquid level in the tank 12 rises to a predetermined value, the valve 42 is closed. When the liquid level in the tank 11 falls, the valve 41 is opened, and when the liquid level in the tank 11 rises to a predetermined value, the valve 41 is closed.

As such, the valves 41 to 43 are configured to operate together with the liquid level sensors of the tanks 11 to 13 on the lower side of the valves 41 to 43 respectively so that the valves 41 to 43 close when the liquid source 25 accumulates up to a specified liquid level. Specifically, the valve 43 between the tanks 12 and 13 operates together with the liquid level sensors 83a to 83d of the tank 13 on the lower side thereof so that the valve 43 is closed when the liquid source 25 accumulates up to a specified liquid level in the tank 13. The valve 42 between the tanks 11 and 12 operates together with the liquid level sensors 82a to 82d of the tank 12 on the lower side thereof so that the valve 42 is closed when the liquid source 25 accumulates up to a specified liquid level in the tank 12. The valve 41 operates together with the liquid level sensors 81a to 81d of the tank 11 so that the valve 41 is closed when the liquid source 25 accumulates up to a specified liquid level in the tank 11. And when the film forming apparatus finishes a film forming process, the valves 41 to 43 are opened so that the insides of the tanks 11 to 13 are recharged with the liquid source 25.

Here, the configuration of a vaporizing system 10X (not shown) having one tank which provides the same gas flow rate as the vaporizing system 10A will be described. This vaporizing system 10X has only one tank 11x (not shown) used for tanks. The liquid surface area Sm of the tank 11x is greater than S1. As to the pressure Px in the tank 11x, Px=P1=P2=P3 holds. The vaporizing system 10X can provide the same gas flow rate as the vaporizing system 10A if the liquid surface area Sm of the tank 11x is set equal to S1+S2+S3.

However, because the vaporizing system 10X has only one tank, its installation area is three times that of the vaporizing system 10A. In other words, the vaporizing system 10A can provide the same gas flow rate as the vaporizing system 10X with an installation area that is one third of that of the vaporizing system 10X.

To put it differently, if having the same installation area as the vaporizing system 10X, the vaporizing system 10A can provide a gas flow rate that is three times that of the vaporizing system 10X. If the vaporizing system 10A has the same installation area with providing the same gas flow rate as the vaporizing system 10X, the liquid source 25 may be vaporized at a lower temperature (lower pressure) than with the vaporizing system 10X.

As such, with the vaporizing system 10A, at least one of making the installation area smaller, making the gas flow rate larger, and lowering the temperature of the liquid source 25 as compared with the vaporizing system 10X can be achieved. If a specified amount (a limit on the amount) applies to the liquid source 25, the number of vaporizing systems to be installed (the total amount of the liquid source 25 on one floor) is restricted.

If the tanks 11 to 13 are made smaller as in the present embodiment, the amount of the liquid source 25 that one vaporizing system 10A has can be reduced. Thus, multiple vaporizing systems 10A can be installed on a small area. As a result, the number of apparatuses such as film forming apparatuses installed on one floor can be increased.

For example, letting At liters be the limit on the total amount of the liquid source 25 on one floor and Tx liters be the capacity of the tank 11x, the number of vaporizing systems 10x that can be placed on one floor is no greater than At/Tx. Letting 0.5Tx be the total capacity of the tanks 11 to 13, the number of vaporizing systems 10A that can be placed on one floor is no greater than 2×At/Tx. As such, the number of vaporizing systems 10A installed on one floor can be increased by a factor of the capacity ratio between the tank 11x and the tanks 11 to 13.

As such, in the vaporizing system 10A that is a layered vaporizing system, the tanks 11 to 13 are stacked up, and in each tank 11 to 13, the liquid source 25 is vaporized. Because of having the configuration where the tanks 11 to 13 are layered, the entire vaporizing system 10A can be made smaller with keeping the gas generation capacity. Further, with the vaporizing system 10A, gas of a large flow rate can be obtained with a small installation area.

Further, because the tanks 11 to 13 are stacked up along a vertical direction, the liquid source 25 can be accumulated in the tanks 12, 13 placed below the tank 11 with this simple configuration.

Although in the present embodiment the case where the vaporizing system 10A has three stages of tanks 11 to 13 has been described, the vaporizing system 10A may have two stages of tanks or four or more stages of tanks.

As described above, according to the first embodiment, because the tank 11 is placed on the upper side of the tank 12 in a stacked manner, and the tank 12 is placed on the upper side of the tank 13 in a stacked manner, gas of a large flow rate from the liquid source 25 can be obtained with a small installation area.

Second Embodiment

Next, the second embodiment will be described using FIG. 3. In the second embodiment, gas having a desired pressure is supplied with multiple tanks each of which is made smaller.

Figure 3:
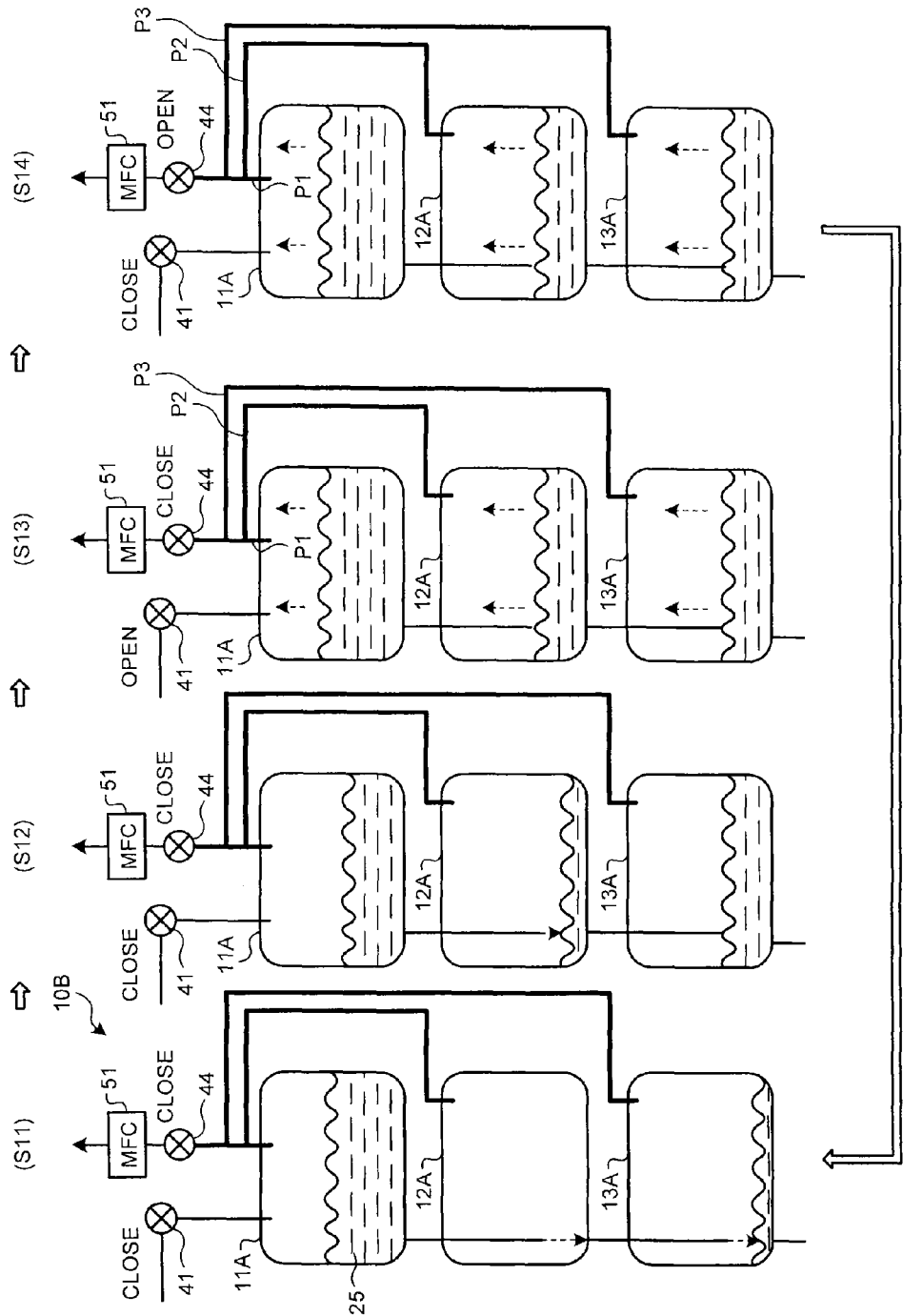
FIG. 3 is a diagram for explaining a vaporization processing procedure in a vaporizing system according to a second embodiment.

FIG. 3 is a diagram for explaining a vaporization processing procedure in a vaporizing system according to the second embodiment. The same reference numerals are used to denote constituents having the same functions as in the vaporizing system 10A of the first embodiment shown in FIG. 1 from among the constituents shown in FIG. 3, with a duplicate description thereof being omitted. Note that in the vaporizing system 10B of FIG. 3, the pressure meter 52, valves 42, 43, liquid level sensors 81a to 81d, 82a to 82d, 83a to 83d, heaters 84, drain valve 45, pipe 64, etc., are omitted from the figure. In the vaporizing system 10B of the present embodiment, tanks 11A to 13A are configured to be smaller than the tanks 11 to 13 as compared with the vaporizing system 10A.

For example, the tanks 11A to 13A have the same depth as the tanks 11 to 13 and have smaller bottoms than the tanks 11 to 13. Since the tanks 11A to 13A have smaller bottoms than the tanks 11 to 13, the liquid level of the liquid source 25 accumulated in the tanks 11A to 13A is smaller in area than the liquid level of the liquid source 25 accumulated in the tanks 11 to 13.

In the vaporizing system 10B, the insides of the tanks 11A to 13A are charged with the liquid source 25 in the same processing procedure as in the vaporizing system 10A. Specifically, when the valve 41 is opened, the liquid source 25 is sent through the pipe 61 into the tank 11A.

Then, when the inside of the tank 11A is charged up to a predetermined height with the liquid source 25, the valve 41 is closed, and the valves 42, 43 are opened. Thus, the liquid source 25 is dribbled into the tanks 12A, 13A (S11).

Then, when the inside of the tank 13A is charged up to a predetermined height with the liquid source 25, the valve 43 is closed. Thus, dribbling the liquid source 25 from the tank 11A into the tank 12A is continued while dribbling the liquid source 25 from the tank 12A into the tank 13A is stopped (S12).

Since the liquid source 25 is dribbled from the tank 11A into the tank 12A, the liquid level of the liquid source 25 in the tank 11A falls. When the liquid level of the liquid source 25 falls to a predetermined height in the tank 11A, the valve 41 is opened. Thus, the liquid source 25 is sent from a liquid feeding device through the pipe 61 into the tank 11A.

Then, when the inside of the tank 12A is charged up to a predetermined height with the liquid source 25, the valve 42 is closed. Thus, dribbling the liquid source 25 from the tank 11A into the tank 12A is stopped (S13). When the inside of the tank 11A is charged up to a predetermined height with the liquid source 25, the valve 41 is closed.

Thereafter, the valve 44 is opened while the valves 41 to 43, 45 are closed. Thus, gas of the pressure P1 is sent from the tank 11A through the pipe 71 to the MFC 51. Further, gas of the pressure P2 is sent from the tank 12A through the pipe 72 to the MFC 51. Yet further, gas of the pressure P3 is sent from the tank 13A through the pipe 73 to the MFC 51 (S14).

As described above, according to the second embodiment, the tank 11A is placed on the upper side of the tank 12A in a stacked manner, and the tank 12A is placed on the upper side of the tank 13A in a stacked manner. Thus, even where the tanks 11A to 13A are made smaller than the tanks 11 to 13, gas of a large flow rate, larger than or equal to that of the above vaporizing system 10X, can be obtained from the liquid source 25.

Third Embodiment

Next, the third embodiment will be described using FIGS. 4 and 5. In the third embodiment, check valves are provided at ends of pipes so that the liquid source 25 in the tank does not flow backward into the pipe via which the liquid source 25 is dribbled.

Figure 4:
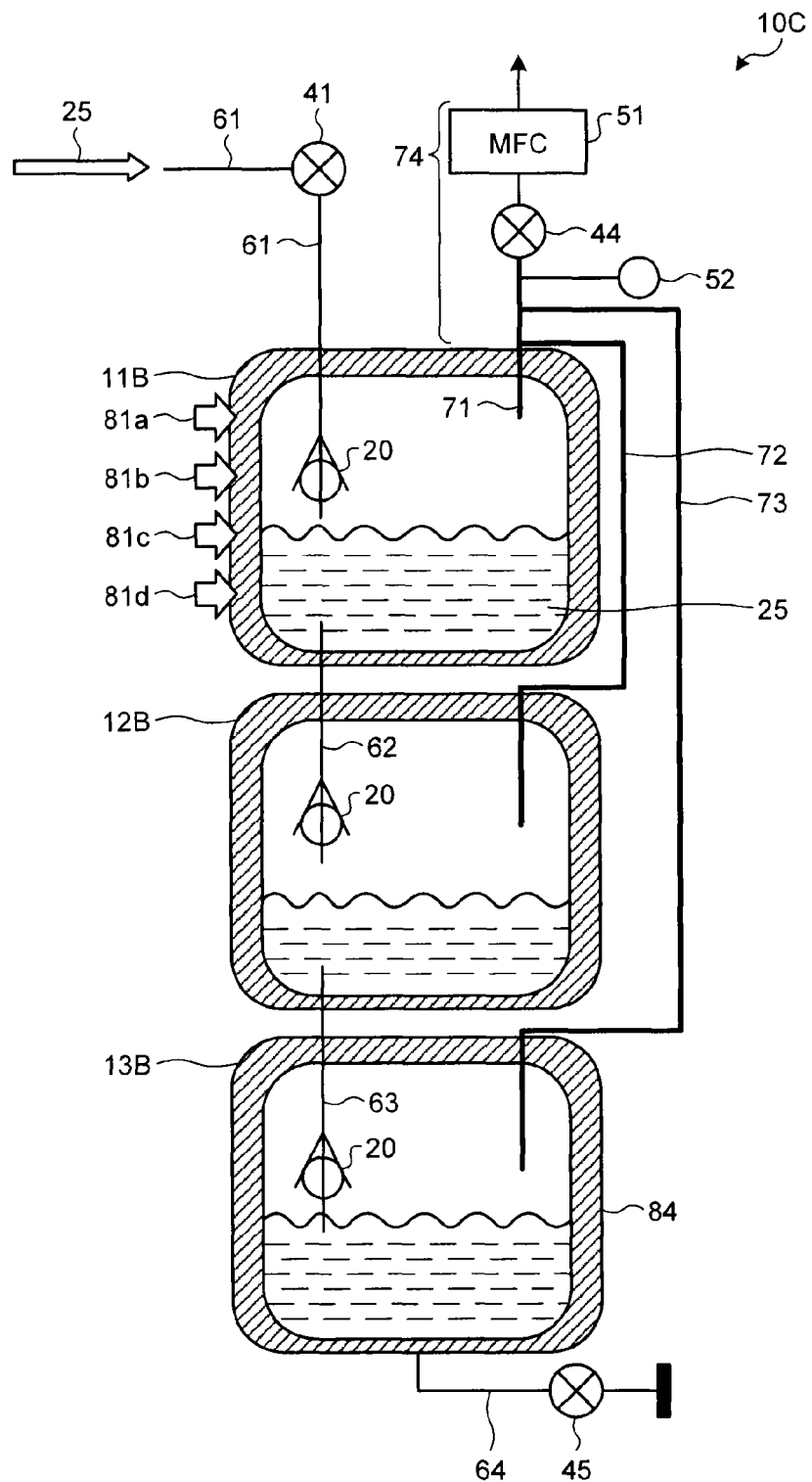
FIG. 4 is a diagram showing the configuration of a vaporizing system according to a third embodiment.

FIG. 4 is a diagram showing the configuration of a vaporizing system according to the third embodiment. FIG. 4 shows schematically the cross-section configuration of the vaporizing system 100. The same reference numerals are used to denote constituents having the same functions as in the vaporizing system 10A of the first embodiment shown in FIG. 1 from among the constituents shown in FIG. 4, with a duplicate description thereof being omitted.

The vaporizing system 100 has tanks 11B to 13B instead of the tanks 11 to 13. In the vaporizing system 100 of the present embodiment, check valves 20 are provided in the pipes 61 to 63.

Specifically, of the ends of the pipe 61, a check valve 20 is provided at the end on the tank 11B side. Of the ends of the pipe 62, a check valve 20 is provided at the end on the tank 12B side. Of the ends of the pipe 63, a check valve 20 is provided at the end on the tank 13B side.

The check valve 20 is a valve to prevent the liquid source 25 accumulated in a tank below from flowing backward into the pipe. For example, the check valve 20 provided in the pipe 63 prevents the liquid source 25 accumulated in the tank 13B from flowing backward through the pipe 63 into the tank 12B. The check valve 20 provided in the pipe 62 prevents the liquid source 25 accumulated in the tank 12B from flowing backward through the pipe 62 into the tank 11B. The check valve 20 provided in the pipe 61 prevents the liquid source 25 accumulated in the tank 11B from flowing backward into the pipe 61.

In the vaporizing system 100, liquid level sensors 81a to 81d are placed in the tank 11B without liquid level sensors being placed in the tanks 12B, 13B. Further, in the vaporizing system 100, the valves 42, 43, between-tank valves, are not provided in the pipes 62, 63.

FIG. 5 is a diagram showing an example configuration of the check valve according to the third embodiment. FIG. 5 shows schematically an example cross-section configuration of the check valve 20. Because the check valves 20 provided in the pipes 61 to 63 have the same configuration, here the configuration of the check valve 20 provided in the pipe 62 will be described.

The check valve 20 is, for example, a float-type backflow preventing valve. The check valve 20 has a float 23 and a string 22. The string 22 is constituted by a string-like member. The float 23 is joined to one end of the string 22, and the other end is joined to the inner wall surface of the pipe 62.

The check valve 20 is configured to block the inlet for liquid from the tank 11B above (the outlet for the liquid source 25 of the pipe 62) when the liquid level in the tank 12B below rises to a height. Specifically, when the liquid level in the tank 12B downstream rises, the float 23 of the check valve 20 rises because of the buoyancy of the float 23. Thus, the float 23 blocks the outlet of the pipe 62. As a result, the liquid source 25 in the tank 11B is stopped from dribbling into the tank 12B while preventing the liquid source 25 in the tank 12B from flowing backward into the pipe 62. With this configuration, in the vaporizing system 100, the valves 42, 43, between-tank valves, need not be placed.

In the case where the valves 42, 43 are not placed, when the liquid source 25 is dribbled from the feeding device of the liquid source 25 into the tank 11B, the liquid source 25 in the tank 11B is dribbled into the tanks 12B, 13B. Then, when the liquid level in the tank 13B at the lower stage rises to a predetermined height, the pipe 63 is closed by the check valve 20. Thus, the liquid source 25 dribbling from the tank 12B into the tank 13B is stopped. Then the liquid source 25 is accumulated in the tank 12B.

Then, when the liquid level in the tank 12B at the middle stage rises to a predetermined height, the pipe 62 is closed by the check valve 20. Thus, the liquid source 25 dribbling from the tank 11B into the tank 12B is stopped. Then the liquid source 25 is accumulated in the tank 11B.

Then, when the liquid level in the tank 11B at the upper stage rises to a predetermined height, the pipe 61 is closed by the check valve 20. Further, the liquid level sensors 81a to 81d detect that the liquid level in the tank 11B at the upper stage has risen to the predetermined height (such a height as to close the pipe 61). Thus, the valve 41 is closed, and as a result, the supply of the liquid source 25 from the feeding device of the liquid source 25 to the tank 11B is stopped.

As described above, according to the third embodiment, without the valves 42, 43 been placed, the liquid source 25 can be accumulated in the tanks 11B to 13B. Thus, the liquid source 25 can be accumulated in the tanks 11B to 13B with a simple configuration.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A vaporizing system comprising:
   a first tank that can accumulate liquid source;
   a second tank that can accumulate the liquid source;
   a first pipe to send first gas generated by the liquid source vaporizing in the first tank out of the first tank therethrough;
   a second pipe to send second gas generated by the liquid source vaporizing in the second tank out of the second tank therethrough;
   a third pipe connected to the first and second pipes and to send out the first and second gas to an external apparatus therethrough,
   a third tank that can accumulate the liquid source; and
   a fourth pipe to send third gas generated by the liquid source vaporizing in the third tank out of the third tank therethrough,
   wherein the first tank is placed on an upper side of the second tank in a stacked manner,
   the third pipe is connected to the fourth pipe and allows the first to third gas to be sent out to the external apparatus therethrough, and
   the second tank is placed on an upper side of the third tank in a stacked manner.

2. The vaporizing system according to claim 1, further comprising a fifth pipe placed between the first tank and the second tank and to dribble the liquid source in the first tank from a bottom side of the first tank into the second tank therethrough.

3. The vaporizing system according to claim 2, further comprising:
   a first liquid level detecting unit that detects a liquid surface height of the liquid source in the second tank; and
   a first valve placed in the fifth pipe,
   wherein when the first liquid level detecting unit detects that a liquid level of the liquid source has reached a first predetermined height, the first valve stops the dribble of the liquid source from the first tank into the second tank.

4. The vaporizing system according to claim 3, wherein when the first liquid level detecting unit detects that the liquid level of the liquid source has fallen to a second predetermined height, the first valve causes the liquid source to resume dribbling from the first tank into the second tank.

5. The vaporizing system according to claim 2, further comprising:
   a first check valve placed in the second tank,
   wherein when a liquid level of the liquid source in the second tank reaches a fifth predetermined height, the first check valve blocks the fifth pipe to stop the dribble of the liquid source from the first tank into the second tank while preventing the liquid source from flowing backward from the second tank to the first tank.
6. The vaporizing system according to claim 2, wherein the fifth pipe extends through a bottom of the first tank and through a top of the second tank.
7. The vaporizing system according to claim 1, further comprising a sixth pipe placed between the second tank and the third tank and to dribble the liquid source in the second tank from a bottom side of the second tank into the third tank therethrough.
8. The vaporizing system according to claim 7, further comprising:
   a second liquid level detecting unit that detects a liquid surface height of the liquid source in the third tank; and
   a second valve placed in the sixth pipe,
   wherein when the second liquid level detecting unit detects that a liquid level of the liquid source has reached a third predetermined height, the second valve stops the dribble of the liquid source from the second tank into the third tank.
9. The vaporizing system according to claim 8, wherein when the second liquid level detecting unit detects that the liquid level of the liquid source has fallen to a fourth predetermined height, the second valve causes the liquid source to resume dribbling from the second tank into the third tank.
10. The vaporizing system according to claim 7, further comprising:
    a second check valve placed in the third tank,
    wherein when a liquid level of the liquid source in the third tank reaches a sixth predetermined height, the second check valve blocks the sixth pipe to stop the dribble of the liquid source from the second tank into the third tank while preventing the liquid source from flowing backward from the third tank to the second tank.
11. The vaporizing system according to claim 7, wherein the sixth pipe extends through a bottom of the second tank and through atop of the third tank.
12. The vaporizing system according to claim 1, further comprising:
    a third valve placed in the third pipe,
    wherein the third valve is placed on a downstream side of connection positions between the third pipe and the first and second pipes.
13. The vaporizing system according to claim 12, further comprising:
    a mass flow controller placed in the third pipe,
    wherein the mass flow controller is placed on a downstream side of the third valve.
14. The vaporizing system according to claim 1, wherein the first, second, and third tanks are surrounded by heaters.
15. The vaporizing system according to claim 1, further comprising a seventh pipe placed on an upper side of the first tank and to dribble the liquid source from a feeding device supplying the liquid source into the first tank therethrough.
16. The vaporizing system according to claim 15, further comprising:
    a third liquid level detecting unit that detects a liquid surface height of the liquid source in the first tank; and
    a fourth valve placed in the seventh pipe,
    wherein when the third liquid level detecting unit detects that a liquid level of the liquid source has reached a seventh predetermined height, the fourth valve stops the supply of the liquid source from the feeding device to the first tank.
17. The vaporizing system according to claim 16, wherein when the third liquid level detecting unit detects that the liquid level of the liquid source has fallen to an eighth predetermined height, the fourth valve causes the liquid source to resume supplying from the feeding device to the first tank.
18. The vaporizing system according to claim 15, further comprising:
    a third check valve placed in the first tank,
    wherein when a liquid level of the liquid source in the first tank reaches a ninth predetermined height, the third check valve blocks the seventh pipe stop the supply of the liquid source from the feeding device to the first tank while preventing the liquid source from flowing backward from the first tank into the seventh pipe.
19. A vaporizing system comprising:
    a first tank that can accumulate liquid source;
    a second tank that can accumulate the liquid source;
    a first pipe to send first gas generated by the liquid source vaporizing in the first tank out of the first tank therethrough;
    a second pipe to send second gas generated by the liquid source vaporizing in the second tank out of the second tank therethrough;
    a third pipe connected to the first and second pipes and to send out the first and second gas to an external apparatus therethrough,
    a seventh pipe placed on an upper side of the first tank and to dribble the liquid source from a feeding device supplying the liquid source into the first tank therethrough;
    a third liquid level detecting unit that detects a liquid surface height of the liquid source in the first tank;
    a fourth valve placed in the seventh pipe; and
    a third check valve placed in the first tank,
    wherein the first tank is placed on an upper side of the second tank in a stacked manner, and
    when the third check valve is closed, and the third liquid level detecting unit detects that a liquid level of the liquid source has reached a tenth predetermined height, the fourth valve stops the supply of the liquid source from the feeding device to the first tank.
20. A vaporizing system comprising:
    a first tank that can accumulate liquid source;
    a second tank that can accumulate the liquid source;
    a first pipe to send first gas generated by the liquid source vaporizing in the first tank out of the first tank therethrough;
    a second pipe to send second gas generated by the liquid source vaporizing in the second tank out of the second tank therethrough;
    a third pipe connected to the first and second pipes and to send out the first and second gas to an external apparatus therethrough;
    a seventh pipe placed on an upper side of the first tank and to dribble the liquid source from a feeding device supplying the liquid source into the first tank therethrough; and
    a third check valve placed in the first tank,
    wherein the first tank is placed on an upper side of the second tank in a stacked manner, and when a liquid level of the liquid source in the first tank reaches a ninth predetermined height, the third check valve blocks the seventh pipe to stop the supply of the liquid source from the feeding device to the first tank while preventing the liquid source from flowing backward from the first tank into the seventh pipe.

* * * * *